(12) United States Patent
Hladik et al.

(10) Patent No.: US 6,715,120 B1
(45) Date of Patent: *Mar. 30, 2004

(54) TURBO DECODER WITH MODIFIED INPUT FOR INCREASED CODE WORD LENGTH AND DATA RATE

(75) Inventors: Stephen Michael Hladik, Albany, NY (US); Abdallah Mahmoud Itani, Ballston Spa, NY (US); Nick Andrew Van Stralen, Ballston Spa, NY (US); Robert Gideon Wodnicki, Schenectady, NY (US); John Anderson Fergus Ross, Del Mar, CA (US)

(73) Assignee: General Electric Company, Niskayuna, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/561,334

(22) Filed: Apr. 28, 2000

Related U.S. Application Data
(60) Provisional application No. 60/132,026, filed on Apr. 30, 1999.

(51) Int. Cl.[7] .......................... H03M 13/29; H03M 13/45
(52) U.S. Cl. .......................... 714/755; 714/780; 714/794
(58) Field of Search ................................ 714/755, 780, 714/786, 794

(56) References Cited

U.S. PATENT DOCUMENTS

| | | | |
|---|---|---|---|
| RE32,905 E | 4/1989 | Baran | 370/104 |
| 5,349,589 A | 9/1994 | Chennakeshu et al. | 371/43 |
| 5,406,570 A | 4/1995 | Berrou et al. | 371/43 |
| 5,446,747 A | 8/1995 | Berrou | 371/45 |
| 5,721,745 A | 2/1998 | Hladik et al. | 371/43 |
| 5,721,746 A | 2/1998 | Hladik et al. | 371/43 |
| 5,734,962 A | 3/1998 | Hladik et al. | 455/12.1 |
| 6,252,917 B1 * | 6/2001 | Freeman | 375/340 |
| 6,271,772 B1 * | 8/2001 | Luschi et al. | 341/51 |
| 6,484,283 B2 * | 11/2002 | Stephen et al. | 714/786 |

FOREIGN PATENT DOCUMENTS

| | | |
|---|---|---|
| EP | 0 735 696 | 10/1996 |
| FR | 2 675 970 | 10/1992 |

OTHER PUBLICATIONS

"Turbo Code Decoder with Controlled Probability Estimate Feedback," JAF Ross; SM Hladik; NA VanStralen, JB Anderson, Serial No. 09/137,257 (GE docket RD–25781), filed Aug. 20, 1998.

"Turbo Code Decoder with Modified Systematic Symbol Transition Probabilities," SM Hladik, JAF Ross; NA VanStralen; Serial No. 09/137,256 (GE docket RD–26016), filed Aug. 20, 1998.

(List continued on next page.)

*Primary Examiner*—Stephen M. Baker
(74) *Attorney, Agent, or Firm*—Jean K. Testa; Patrick K. Patnode

(57) ABSTRACT

A turbo decoder system utilizing a MAP decoding algorithm has a predetermined number of turbo decoder modules for decoding segments of a turbo code component code word in parallel, thereby expanding the block-length and data rate capability of the turbo decoder. Upon completion of any half iteration of the MAP decoding algorithm, the a posteriori bit probability estimates are provided to an interleave/de-interleave-and-convert-data function block wherein they are re-ordered, segmented, used to modify the original received data samples, and provided back to the respective turbo decoder modules as input data samples for the systematic bits. Decoding continues in this manner until a predetermined number of half iterations is performed, and data decisions are made on the final a posteriori estimates.

7 Claims, 4 Drawing Sheets

OTHER PUBLICATIONS

"A Maximum A Posteriori Estimator with a Fast Sigma Calculator," JAF Ross; AM Itani; NA VanStralen; SM Hladik; Serial No. 09/137,260 (GE docket RD–26035), filed Aug. 20, 1998.

"High–Data Rate Maximum A Posteriori Decoder for Segmented Trellis Code Words," SM Hladik; NA VanStralen; JAF Ross; Serial No. 09/137,181 (GE docket RD–26064), filed Aug. 20, 1998.

"Turbo Decoder Control for use with a Programmable Interleaver, Variable Block Length, and Multiple Code Rates," NA VanStralen; SM Hladik; AM Itani; RG Wodnicki; JAF Ross; Serial No. 09/519,903 (GE docket RD–26062/USA), filed Mar. 7, 2000.

"Modular Turbo Decoder for Expanded Code Word Length," SM Hladik; AM Itani; NA VanStralen, RG Wodnicki; JAF Ross; Serial No. 09/561,333 (GE docket RD–26095/USA), filed Apr. 28, 2000.

"The Turbo Coding Scheme," Jakob Dahl Anderson, Report IT–146 ISSN 0105–854, Jun. 1994, Revised Dec. 1994, pp. 1–48.

"An Efficient Adaptive Circular Viterbi Algorithm for Decoding Generalized Tailbiting Convolutional Codes," Richard V. Cox, Car–Erik W. Sundberg; IEEE Transactions on Vehicular Technology, vol. 43, No. 1, Feb. 1994, pp. 57–68.

"On Tail Biting Convolutional Codes," Howard H. Ma; Jack K. Wolf, IEEE Transactions on Communications, vol. Com–34, No. 2, Feb., 1990, pp. 104–111.

"An Efficient Maximum Likelihood Decoding Algorithm for Generalized Tailbiting Convolutional Codes Including Quasicyclic Codes," Qiang Wang and Vijay K. Bhargava, IEEE Transactions on Communications, vol. 37, No. 8, Aug. 1989, pp. 875–879.

"Illuminating the Structure of Code and Decoder of Parallel Concatenated Recursive Systematic (Turbo) Codes," Patrick Robertson, IEEE, 1994, pp. 1298–1303.

"Near Shannon Limit Error–Correcting Coding and Decoding Turbo–Codes (1)," Claude Berrou, Alain Glavieux, Punya Thitimajshima, IEEE, 1993, pp. 1064–1070.

"Optimal Decoding of Linear Codes for Minimizing Symbol Error Rate," LR Bahl; J. Cocke; F. Jelinek; J. Raviv; IEEE Transactions on Information Theory, Mar. 1974, pp. 284–287.

"Near Optimum Error Correcting Coding and Decoding: Turbo–Codes," Claude Berrou; IEEE Transactions on Communications, vol. 44, No. 10, Oct. 1996, pp. 1261–1271.

"A Comparison of Optimal and Sub–Optimal Map Decoding Algorithms Operating in the Log Domain," Patrick Robertson; Emmanuelle Villebrun; Peter Hoeher; IEEE 1995, pp. 1009–1013.

"Terminating the Trellis of Turbo–Codes in the Same State," AS Barbulescu; SS Pietrobon; Electronics Letters $5^{th}$ Jan., 1995 vol. 31, No. 1, pp. 22–23.

"Terminating the Trellis of Tubo–Codes," O. Joerssen; H. Meyr; Electronics Letters $4^{th}$ Aug., 1994 vol. 30, No. 16, pp. 1285–1286.

"A Viterbi Algorithm with Soft–Decision Outputs and its Applications," Joachim Hagenauer; Peter Hoeher; IEEE 1989, pp. 1680–1686.

"Decision Depths of Convolutional Codes," John B. Anderson; Kumar Balachandran; IEEE Transactions on Information Theory, vol. 35, No. 2, Mar. 1989, pp. 455–459.

"Source and Channel Coding, An Algorithmic Approach," John B. Anderson; Seshadri Mohan, pp. 216, 336–342.

* cited by examiner

TURBO DECODER WITH MODIFIED INPUT FOR INCREASED CODE WORD LENGTH AND DATA RATE

CROSS REFERENCE TO RELATED APPLICATIONS

This application claims the benefit of U.S. Provisional Application No. 60/132,026, filed Apr. 30, 1999.

BACKGROUND OF THE INVENTION

The present invention relates generally to error-correction coding and, more particularly, to a decoder for parallel convolutional codes, i.e., turbo codes.

A new class of forward error control codes, referred to as turbo codes, offers significant coding gain for power limited communication channels. Turbo codes are generated using two or more recursive systematic encoders operating on different orderings of the same information bits. A subset of the code bits generated by each encoder is transmitted in order to maintain bandwidth efficiency. Turbo decoding involves an iterative algorithm in which probability estimates of the information bits that are calculated for one of the received component code words are fed back to a probability estimator comprising the decoder component code words for the other component code words. Each iteration of decoder processing generally increases the reliability of these probability estimates. This process continues, cyclically decoding the component code words until the probability estimates can be used to make reliable decisions.

The maximum a posteriori (MAP) type algorithm introduced by Bahl, Cocke, Jelinek, and Raviv in "Optimal Decoding of Linear Codes for Minimizing Symbol Error Rate", *IEEE Transactions on Information Theory*, Mar. 1974, pp. 284–287, is particularly useful as a component decoder in decoding parallel concatenated convolutional codes, i.e., turbo codes. The MAP algorithm is used in the turbo decoder to generate a posteriori probability estimates of the information bits that have been encoded into the code word. These probability estimates are used as a priori bit probabilities for the second MAP decoder. Three fundamental terms in the MAP algorithm are the forward and backward state probability functions (the alpha and beta functions, respectively) and the a posteriori transition probabilities (the sigma functions).

A known characteristic of turbo codes is that their error correction capability increases with code word length. However, there is some practical limit on the length of a code word that can be decoded with a MAP-algorithm decoder implementation. Accordingly, it is desirable to provide a modular turbo decoder structure capable of decoding longer code word lengths. It is furthermore desirable to provide such a turbo decoder while increasing coding gain and data rate.

BRIEF SUMMARY OF THE INVENTION

A turbo decoder system utilizing a MAP decoding algorithm comprises a predetermined number M of turbo decoder modules for decoding segments of a turbo code component code word in parallel, thereby expanding the block-length and data rate capability of the turbo decoder system. In an exemplary system, each turbo decoder module has a predetermined maximum code-word size corresponding to N information bits and a predetermined maximum decoding rate. For the first half iteration of the MAP decoding algorithm, the inputted turbo code word (corresponding to M·N information bits) is divided into M segments, and turbo decoding of these segments is done in parallel by the turbo decoders. The resulting a posteriori bit probability signals are provided to an interleaver/de-interleaver-and-convert-data (ICD) block wherein they are re-ordered according to the interleaver definition thereof. After interleaving, the a posteriori bit probabilities are used to modify the values of received data samples. Following modification of the received data sample values, the modified data samples are segmented and provided as input data samples corresponding to the bottom component code word for the second half iteration of the MAP decoding algorithm. At the end of the second half iteration, the output a posteriori bit probabilities are provided by the component code word decoder to the ICD block and re-ordered according to the de-interleaver definition therein. After de-interleaving, the fed back a posteriori bit probabilities are used to modify the values of received data samples to be used in the subsequent decoding half iteration. Decoding continues in this manner until a predetermined number of half iterations are performed, and data decisions are made on the final a posteriori estimates.

DETAILED DESCRIPTION OF THE INVENTION

Figure 1:
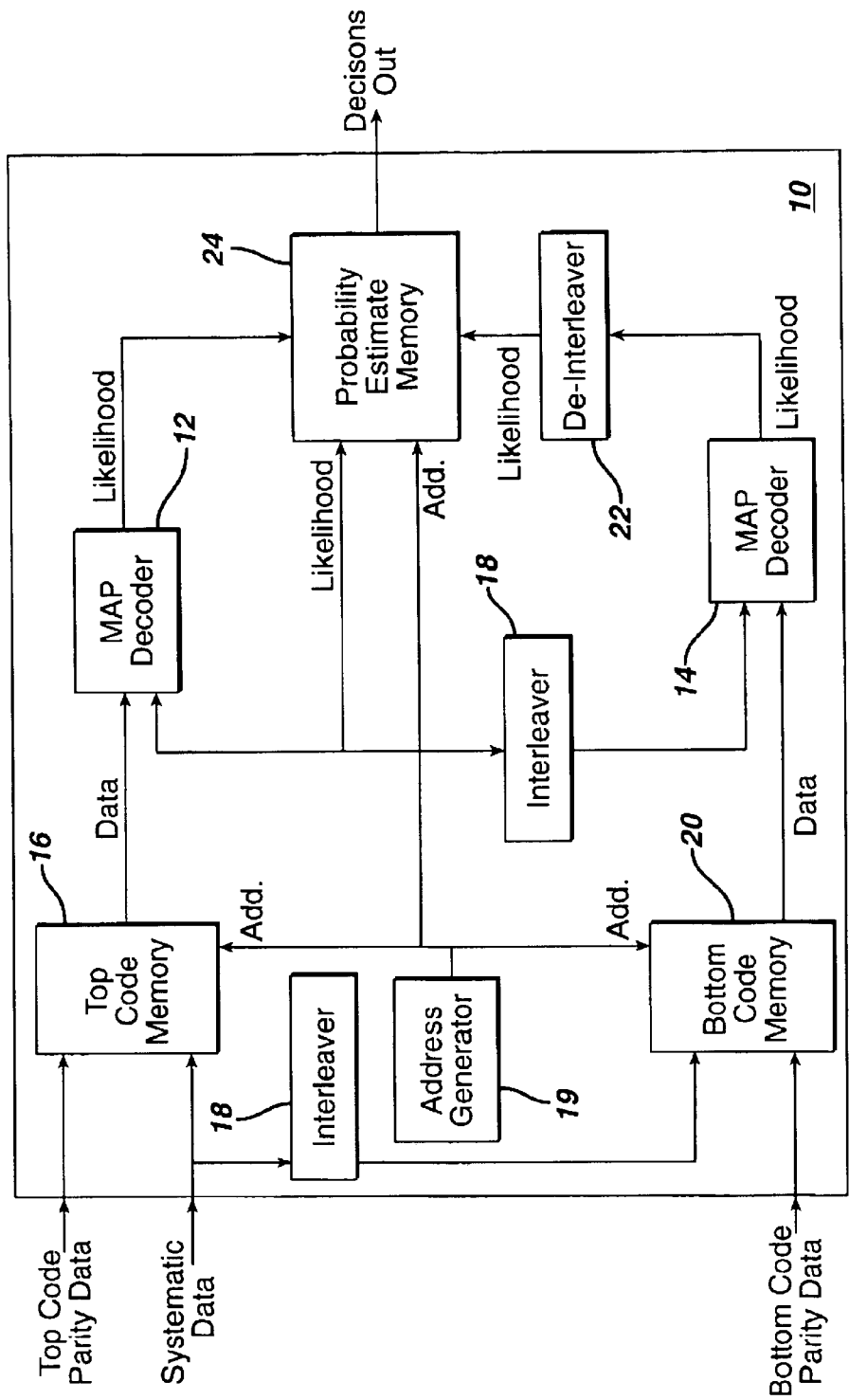
FIG. 1 is a block diagram illustrating a typical turbo decoder utilizing a MAP decoding algorithm.

A MAP decoder provides estimates of the a posteriori probabilities of the states and transitions of a Markov source through a discrete memory-less channel. The transition probabilities of a discrete memory-less channel depend on the transitions $X_1^\tau$ of the Markov source and the observations $Y_1^\tau$ such that for a sequence, $$Pr\{Y_1^t \mid X_1^t\} = \prod_{j=1}^{t} R(Y_j \mid X_j) \qquad 1$$

where $R(\bullet|\bullet)$ defines the channel transition probabilities.

The MAP decoder uses the received sequence $Y_1^\tau$ to estimate the a posteriori state and transition probabilities of the Markov source.

$$Pr\{S_t=m|Y_1^\tau\}=Pr\{S_t=m;Y_1^\tau\}/Pr\{Y_1^\tau\}=\lambda_t(m)/Pr\{Y_1^\tau\} \qquad 2$$

and $$Pr\{S_{t-1}=m';S_t=m|Y_1^\tau\}=Pr\{S_{t-1}=m';S_t=m;Y_1^\tau\}/Pr\{Y_1^\tau\}=\sigma_t(m',m)/Pr\{Y_1^\tau\} \qquad 3$$

where $S_t$ is the state of the source at time t.

The alpha, beta and gamma functions defined forth as follows:

$$\alpha_t(m)=Pr\{S_t=m;Y_1^\tau\} \qquad 4$$

$$\beta_t(m)=Pr\{Y_{t+1}^\tau|S_t=m\} \qquad 5$$

and $$\gamma_t(m',m)=Pr\{S_t=m;Y_t|S_{t-1}=m'\} \qquad 6$$

so that $$\lambda_t(m)=\alpha_t(m)\cdot\beta_t(m) \qquad 7$$

and $$\sigma_t(m',m)=\alpha_{t-1}(m')\cdot\gamma_t(m',m)\cdot\beta_t(m) \qquad 8$$

The alpha function can be computed from the following recursion:

$$a_t(m) = \sum_{m'} \alpha_{t-1}(m')\cdot\gamma_t(m',m). \qquad 9$$

The beta function can be calculated using the following recursion:

$$\beta_t(m) = \sum_{m'} \beta_{t+1}(m')\cdot\gamma_{t+1}(m,m'). \qquad 10$$

Finally, the gamma function can be calculated as follows:

$$\gamma_t(m',m) = \sum_X p_t(m|m')\cdot q_t(X|m',m)\cdot R(Y_t|X), \qquad 11$$

where $p_t(m|m')$ are the transition probabilities of the Markov source, and $q_t(X|m',m)$ is the distribution of the source's output symbols conditioned on the source's state transitions, and $R(Yt|X)$ is the channel probability function.

By way of illustration, the most common case of a turbo code comprising two component codes is described herein, but it is to be understood that the invention described herein applies generally to other turbo codes. For the exemplary case, turbo codes are constructed as two recursive systematic codes concatenated in parallel. A MAP decoder for a turbo code generates a probability estimate of the information bits in a component code word, based on one of the two recursive systematic codes comprising the turbo code, and provides these probability estimates to a second MAP decoder which decodes the other component code word of the turbo code word. The second decoder uses these probabilities as a priori information and generates new probability estimates of the information bits encoded in the code word. The updated estimates are provided to the first MAP component decoder, which, in turn, generates updated estimates. This feedback process continues a finite number of times, and a decision on the information bits is made based on the final probability estimates. Each operation of a component MAP decoder is referred to as a half iteration.

The two parallel component codes in a turbo code are referred to herein as the top code and the bottom code. Normally, the data is encoded by the top code and is interleaved using either a fixed-block interleaver or a random interleaver before being encoded by the bottom code.

FIG. 1 illustrates a turbo decoder 10 employing component MAP decoders 12 and 14. The inputs to the turbo decoder of FIG. 1 are elements of the composite turbo code word. The systematic data is a sequence of symbols that correspond to the information bits; the top-code parity data are symbols that correspond to the parity bits generated by the top component encoder; and the bottom code parity data are symbols that correspond to the parity bits generated by the bottom component encoder of the turbo encoder. As shown, the top code parity data is provided along with the systematic data to a top code memory 16 and then to MAP decoder 12. The systematic data is also provided, via an interleaver 18, along with the bottom code parity data to a bottom code memory 20 and then to the second MAP decoder 14. FIG. 1 also shows the feedback loop involving MAP decoders 12 and 14, interleaver 18, de-interleaver 22, a probability estimate memory 24, and an address generator 19 for implementing a MAP decoding algorithm as described hereinabove.

The systematic (i.e., information) bit probability estimates are computed using the a posteriori state transition or $\sigma_t(m',m)$ probabilities. The sum of all a posteriori transition probabilities resulting from the same information bit value is the a posteriori probability bit estimate. The output of a MAP component decoder is an a posteriori probability estimate of the information bits, denoted as $APP_t(0)$ and $APP_t(1)$, as set forth in the following expression:

$$APP_t(k)=Pr\{d_t=k|Y_1^\tau\}=\Sigma\sigma_t(m',m) \qquad 12$$

where the summation is over all $\sigma_t(m',m)$ values where the information bit corresponding to the encoder state transition (m', m) is k.

The calculated a posteriori systematic bit probabilities are stored in memory as likelihood ratios, that is, $APP_t(1)/APP_t(0)$.

Although the description herein is given with respect to non-logarithmic functions, it is to be understood that a logarithmic implementation is preferred for many applications. To this end, the mathematical expressions herein may be converted to logarithmic expressions in known fashion.

Figure 2:
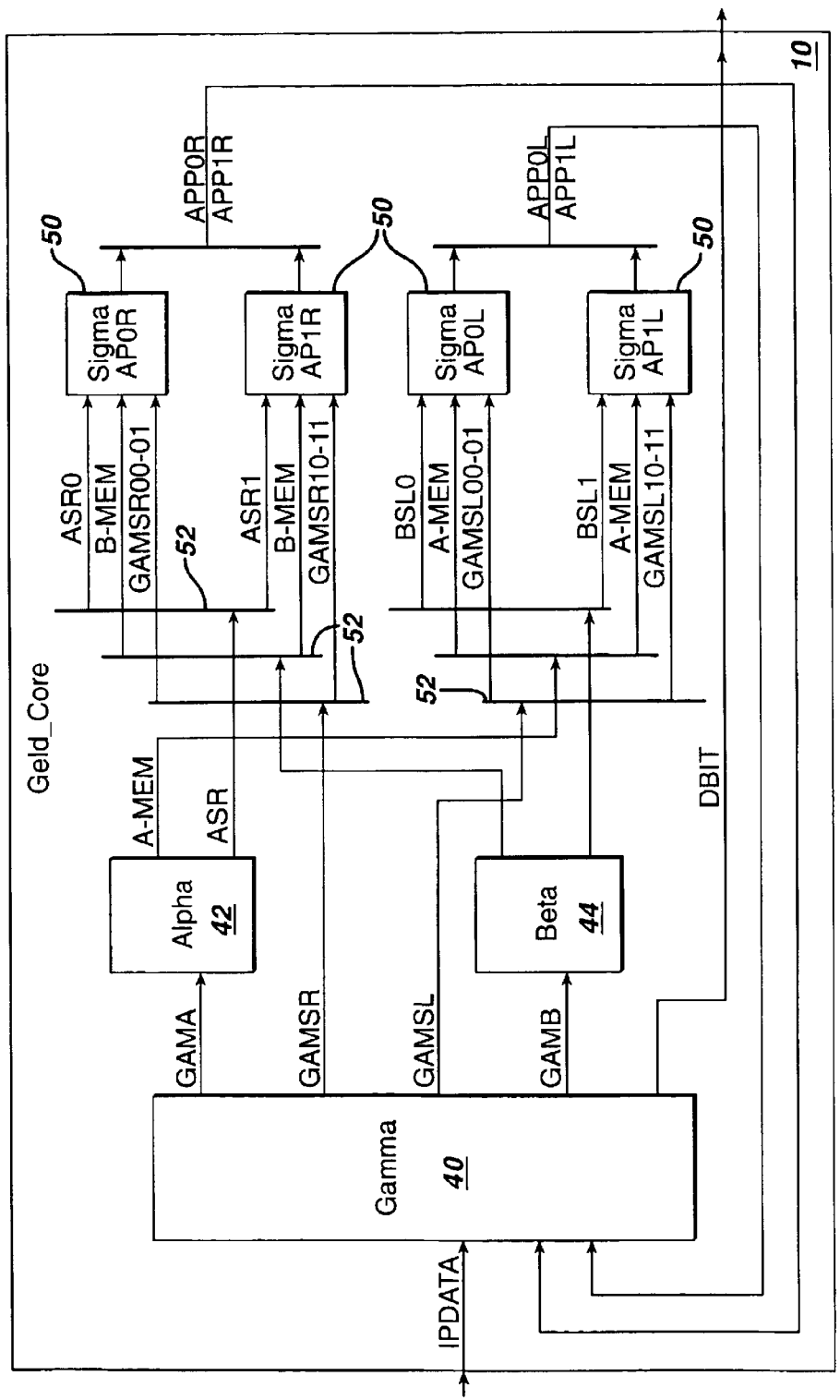
FIG. 2 is a block diagram illustrating a top level view of data flow in a MAP component decoder such as that of FIG. 1.

FIG. 2 is a top level view illustrating an exemplary turbo decoder data flow structure. The functional blocks within the turbo decoder in the data path are the gamma calculator block 40, the alpha calculator block 42, the beta calculator block 44, and the sigma blocks 50. Received symbols IPDATA and the a posteriori bit probability estimates from the sigma blocks are provided as inputs to the gamma block. Four gamma values are outputted from the gamma block, one gamma value being provided to each of the alpha and beta blocks (GAMA and GAMB, respectively); and the other gamma values (GAMSR and GAMSL) being provided via multiplexers 52 to the sigma blocks along with the present alpha and beta values (ASR, BSL) and the alpha and beta values stored in memory (A-MEM and B-MEM).

As illustrated, four sigma blocks 50 calculate the sigma values for the state transitions in the trellis. These blocks also compute an update of the a posteriori probability associated with each of the information (systematic) bits in the code word. The probability of the transmitted bit being zero (AP0R, AP0L) is computed simultaneously with the probability of the bit being one (AP1R, AP1L). Since symbol-by-symbol MAP decoding involves both forward (from the beginning to the end of the received component code word) and backward (from the end to the beginning of the received component code word) recursive calculations, as described in U.S. patent application Ser. No. 09/137,260, filed Aug. 20, 1998, the turbo decoder processes the received symbols comprising the received component code words of the received turbo code word sequentially from the first received to the last received for the forward recursion and from the last received symbol to first for the backward recursion substantially simultaneously. These operations are performed in parallel in order to minimize the delay which would otherwise result from serial sigma block calculations.

Figure 3:
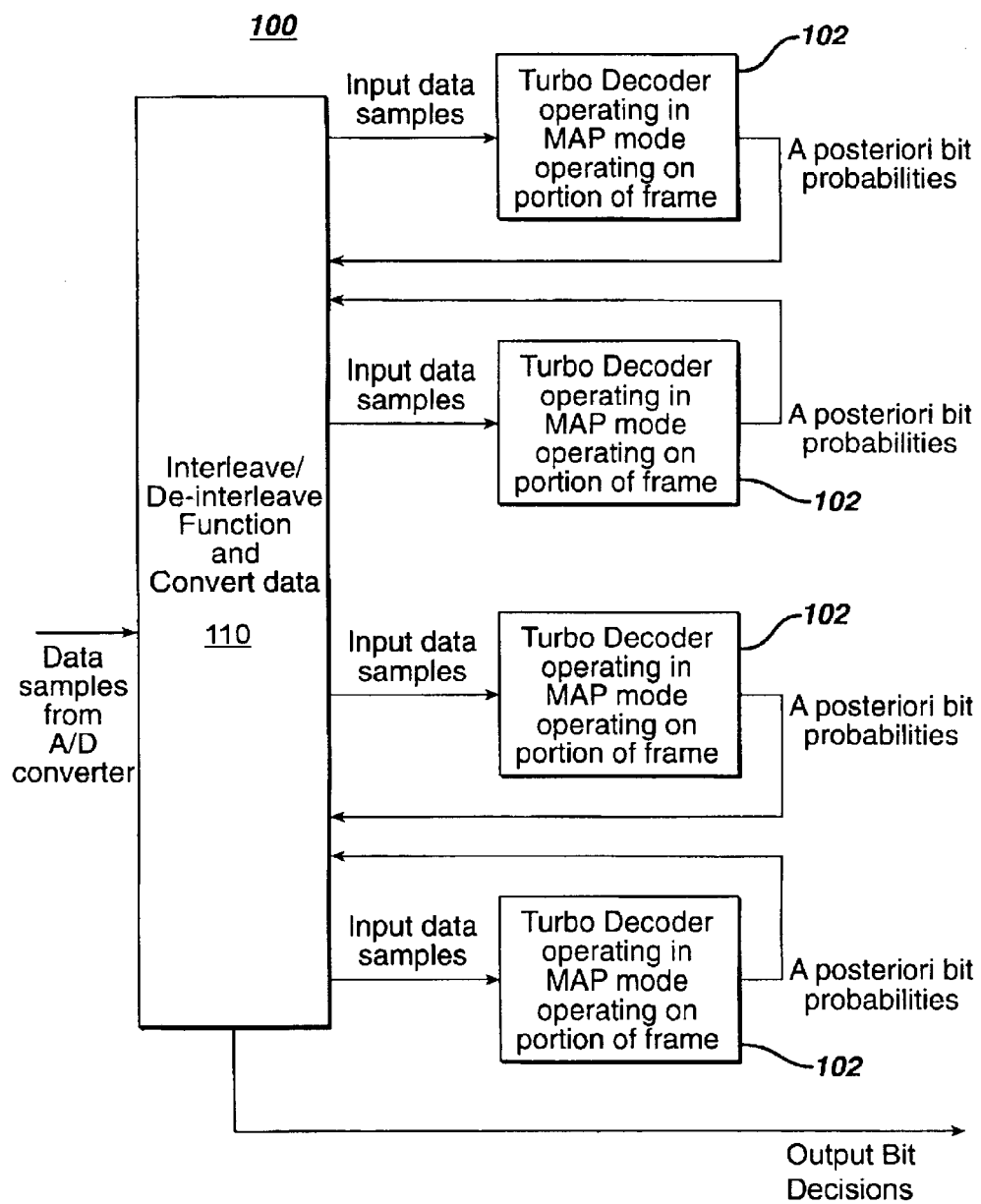
FIG. 3 is a block diagram illustrating an exemplary embodiment of a turbo decoder system of the present invention employing an interleaver/de-interleaver-and-convert-data block and multiple turbo decoder modules for increasing code word length and data rate capability.

FIG. 3 illustrates a turbo decoding system 100 employing multiple turbo decoder modules, or chips, 102 for decoding a code word which exceeds the maximum length each respective chip is capable of decoding. By way of example only, four turbo decoder modules 102 are illustrated. System 100 is illustrated as comprising an interleave/de-interleave-and-convert-data (IDC) block 110 which receives data comprising turbo code words from an analog-to-digital (A/D) converter (not shown). Each turbo code word comprises information bits and parity bits. IDC block 110 partitions the received turbo code words into multiple segments, each respective segment being provided to a respective decoder chip 102. For the first half iteration of the turbo decoder MAP decoding algorithm, the inputted segments respectively correspond to those required to decode the top component code word. The turbo decoding of the code word segments for the first half iteration by multiple turbo decoder chips involves parallel (i.e., simultaneous) decoding of the respective segments of the turbo code word by the multiple chips. Upon completion of the first half iteration of decoding, a posteriori bit probability signals (APP's) are provided to the DC block wherein they are re-ordered according to the interleaver definition thereof. The interleaver (and de-interleaver) length corresponds to the total length of the received composite turbo code word, i.e., before segmenting. After interleaving, the a posteriori bit probabilities are used to modify, or convert, the actual received data samples from the A/D converter. Following this modification, modified received data sample values are partitioned into updated received code word segments for decoding and provided as input data samples to the appropriate decoder module for the second half iteration of the MAP decoding algorithm.

Exemplary embodiments of this invention are particularly useful if the component decoders comprising the turbo decoder for increased code word length either do not allow the input of arbitrary a priori bit probabilities or do not allow dynamic input of new a priori bit probabilities for each iteration of component code word decoding. (Throughout this document, an iteration of component code word decoding has been referred to as a "half iteration" for brevity. The term originates from the fact that one complete decoding iteration of a turbo code word requires the decoding of two component code words for the case when the turbo code comprises two component codes. This is an exemplary embodiment that has been chosen to describe the invention.)

The decoding of turbo code words, which exceed the code word length of the component MAP decoders, requires that the requisite interleaving and de-interleaving functions be implemented in a module which is external to the MAP decoders. Similarly, some mechanism is required to provide the feedback of a posteriori bit probabilities, associated with a code word segment from the subsequent component code word to be decoded, to the component decoder which will decode a given component code word segment in the next iteration. In general, these may have been computed by any or all of the component decoders due to the interleaving that is inherent in turbo coding. In preferred embodiments of this invention, this feedback is affected by modifying the values of selected input data samples, comprising a received code word segment, for each decoding iteration. The rationale for this method can be understood by an inspection of equations (1) through (12), which describe the symbol-by-symbol MAP decoding algorithm. It is evident that the a priori bit probabilities are only used directly in the calculation of the intrinsic gamma function values.

From equation (11), the intrinsic gamma function can be calculated as follows, assuming a rate ½ component code word and binary signaling:

$$\gamma_t(m', m) = \sum_X p_t(m \mid m') \cdot q_t(X \mid m', m) \cdot R(Y_t \mid X) \quad (13)$$

$$= AP(d_t)R(Y_i \mid X_i)R(Y_p \mid X_p),$$

where $AP(d_t)$ is the a priori probability of the bit value $d_t$, $R(Y_i|X)$ is the probability of receiving the symbol $Y_i$ given that the symbol $X_i$ is transmitted, and $R(Y_p|X)$ is probability of receiving the symbol $Y_p$ given that the symbol $X_p$ is transmitted. In this case, the transmitted symbol sequence X corresponding to an encoder state transition from state m' to state m (caused by bit $d_t$ being input to the encoder) is ($X_i$, $X_p$). The corresponding received symbol sequence $Y_t$ is ($Y_i$, $Y_p$). Equation (13) suggests that modifying the value of either of these received symbols appropriately would allow updated a priori bit probability values to affect the calculation of the intrinsic gamma function in each iteration even though the component decoder does not provide for them to be input directly. However, as is taught in U.S. patent application Ser. No. 09/137,260, filed Aug. 20, 1998, a preferred embodiment of the component MAP decoders calculate the a posteriori bit probabilities (or equivalently the a posteriori bit likelihood ratios) directly from the extrinsic gamma function, defined as follows $$\gamma_t^e(m',m)=R(Y_p|X_p). \quad (14)$$

The output a posteriori bit probabilities are then used as a priori bit probabilities in the subsequent decoding iteration. Since $\gamma_t^e(m',m)$ is independent of the a priori bit probabilities, a preferred embodiment of this invention modifies the values the received systematic symbols $Y_i$ for each iteration of component code word decoding.

The values of the input data samples corresponding to the systematic symbols, i.e. received systematic symbols, are modified as a function of the associated a priori bit probabilities according to one of the following preferred embodiments. In all of the following, $\hat{Y}_i$ represents the modified input data sample value corresponding to a systematic symbol. In one embodiment, the input data samples $Y_i$ are modified according to the equation $$R(\hat{Y}_i|X_1=0)=R(Y_i|X_i(d_t=0)) \, AP(d_t=0). \quad 15$$

In another embodiment, the input data samples Yi are modified according to the equation $$R(\hat{Y}_i|X_1=0)=R(Y_i|X_i(d_t=0)) \, AP(d_t=1). \quad 16$$

In yet another embodiment, $\hat{Y}_i$ is calculated as the solution the following equation:

$$\frac{R(\hat{Y}_i \mid 0)}{R(\hat{Y}_i \mid 1)} = \frac{AP(0)_i R(Y_i \mid 0)}{AP(1)_i R(Y_i \mid 1)} \quad 17$$

where R(X|Y) is the channel probability function used within each turbo decoder 102, as described hereinabove, and $AP(X)_i$ is the desired a priori symbol probability estimate associated with the systematic data sample $Y_i$. In the case of binary signaling, the a priori channel symbol probability is the same as the a priori bit probability. In a preferred embodiment, the channel probability function R(Yt|X) is implemented as a table look-up.

Before the start of the second half iteration of the turbo decoding MAP decoding algorithm, A/D data samples corresponding to the bottom component code are modified in the same manner as described hereinabove and are provided to the respective turbo decoder chips 102. At the end of the second half iteration, the a posteriori outputs (APP's) of the individual turbo decoder chips again pass through the IDC function block 110 wherein they are again re-ordered, albeit this time with the de-interleaver definition. After de-interleaving, these values are provided to the respective turbo decoder chips according to the segments of the top component code (in like manner as the first half iteration), used to modify the original A/D samples to which they correspond, and provided to the respective turbo decoders for the third half iteration. In an exemplary embodiment, the same decoder chips are used to decode the corresponding segments as in the first iteration such that the parity bits needed for the third half iteration have already been provided thereto and retained in memory.

Upon completion of any half iteration of the MAP turbo decoding algorithm, the a posteriori bit probability estimates (APP's) are provided to the IDC function block 110, where they are re-ordered, segmented, used to modify the original A/D data samples, and provided back to the respective turbo decoder chips as input data samples for the systematic bits. At the end of odd-numbered half iterations, the a posteriori probabilities are re-ordered according to the interleaver definition, while at the end of even-numbered half iterations, they are re-ordered according to the de-interleaver definition. Decoding continues until the desired number of half iterations have been performed. Data decisions are made on the final a posteriori probability estimates.

Figure 4:
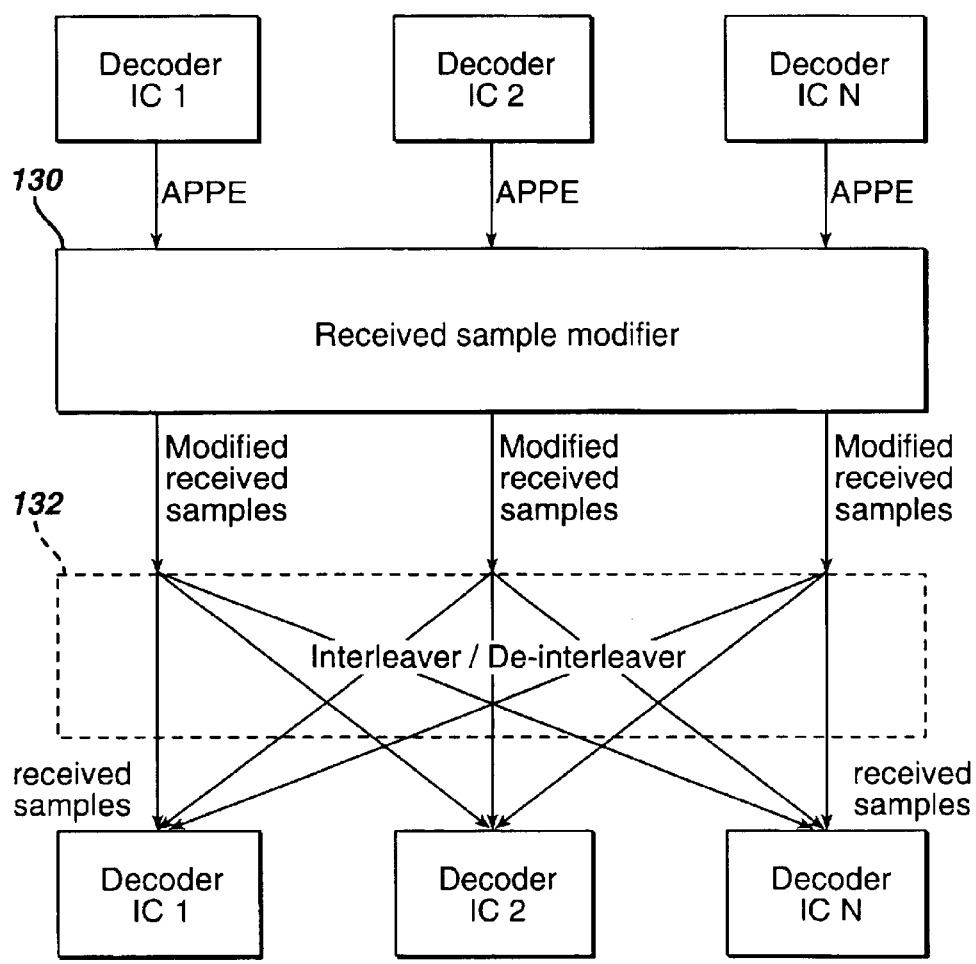
FIG. 4 is a block diagram illustrating the data flow, interleaving, and code word segmentation used in an exemplary embodiment of a turbo decoder system of the present invention.

FIG. 4 illustrates an alternative exemplary embodiment of a turbo decoder system according to the present invention wherein the received samples are modified, or converted, in a function block 130 before being provided to an interleaver/de-interleaver block 132. The order of functions (i.e., modifying and interleaving/de-interleaving) is not critical and may be varied depending upon the application.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A turbo decoder system, comprising:
   a plurality M of turbo decoder modules, each for decoding a maximum code word size corresponding to N information bits according to a MAP decoding algorithm;
   interleave/de-interleave-and-convert-data (IDC) circuitry for receiving input data samples having an (M·N)-bit block-length, the IDC circuitry segmenting the input data samples into M segments, the IDC having predetermined interleaver and de-interleaver definitions therein, each respective segment being provided to a respective turbo decoder module which provides as output a posteriori bit probabilities based on the respective segment of input data samples, the IDC circuitry re-ordering and modifying the input data samples based on the a posteriori bit probabilities, the IDC circuitry providing the re-ordered and modified data samples to the turbo decoder modules for a predetermined number of decoding iterations.

2. The system of claim 1 wherein the a posteriori bit probabilities are re-ordered according to the interleaver definition upon the end of odd-numbered half iterations and according to the de-interleaver definition upon the end of even-numbered half iterations.

3. The system of claim 1 wherein the interleave/de-interleave functions of the IDC circuitry occur before the convert data function.

4. The system of claim 1 wherein the interleave/de-interleave functions of the IDC circuitry occur after the convert data function.

5. A method for turbo decoding input data samples, each input data sample having an (M·N)-bit block-length:
   segmenting the input data samples into M segments, each respective segment being provided to a respective turbo decoder module which provides as outputs a posteriori bit probabilities based on the respective segment of input data samples;
   re-ordering and modifying the input data samples based on the a posteriori bit probabilities for a predetermined number of decoding iterations; the input data samples being re-ordered according to an interleaver definition upon odd-numbered half iterations and according to a de-interleaver definition upon even-numbered half iterations; and
   making data decisions based on the final a posteriori bit probabilities.

6. The method of claim 5 wherein re-ordering occurs before modifying upon each half iteration.

7. The method of claim 5 wherein modifying occurs before re-ordering upon each half iteration.

\* \* \* \* \*